(12) United States Patent
Hedler et al.

(10) Patent No.: US 6,916,185 B2
(45) Date of Patent: Jul. 12, 2005

(54) CONNECTION OF INTEGRATED CIRCUIT TO A SUBSTRATE

(75) Inventors: Harry Hedler, Germering (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/464,429

(22) Filed: Jun. 18, 2003

(65) Prior Publication Data

US 2004/0036181 A1 Feb. 26, 2004

(30) Foreign Application Priority Data

Jun. 19, 2002 (DE) .......................................... 102 27 342

(51) Int. Cl.[7] .......................... H01R 12/00; H05K 1/00
(52) U.S. Cl. ....................................................... 439/83
(58) Field of Search ............. 439/83, 876; 257/737–738

(56) References Cited

U.S. PATENT DOCUMENTS

| | | | |
|---|---|---|---|
| 5,056,215 A | 10/1991 | Blanton ....................... | 29/840 |
| 5,400,950 A | 3/1995 | Myers et al. .......... | 228/180.22 |
| 5,448,114 A | 9/1995 | Kondoh et al. ............. | 257/778 |
| 5,598,036 A * | 1/1997 | Ho .............................. | 257/738 |
| 5,633,535 A | 5/1997 | Chao et al. ................. | 257/778 |
| 5,796,169 A | 8/1998 | Dockerty et al. ........... | 257/780 |

FOREIGN PATENT DOCUMENTS

DE 19702186 C2 1/1997

* cited by examiner

*Primary Examiner*—Javaid H. Nasri
(74) *Attorney, Agent, or Firm*—Fish & Richardson P.C.

(57) ABSTRACT

The present invention provides a method of connecting an integrated circuit to a substrate and a corresponding circuit arrangement. Connecting occurs by performing the steps of: providing a main area (HF1) of the integrated circuit (1), which has an electrical contacting region (2), with a mechanical supporting structure (3a, 3b; 33a, 33b, 33c; 43a, 43b, 43c); providing a solderable surface region (5a, 5b; 35a, 35b, 35c; 60a, 60b, 60c) of the mechanical supporting structure (3a, 3b; 33a, 33b, 33c; 43a, 43b, 43c); providing a solderable terminal region (10; 5, 30; 40, 50), which is electrically connected to the electrical contacting region (2), on the main area (HF1) of the integrated circuit (1); providing a main area (HF2) of the substrate (20) with a first soldering region (22', 23'; 22', 23', 22", 23"), which can be aligned with the solderable surface regions (5a, 5b; 35a, 35b, 35c; 60a, 60b, 60c), and with a second soldering region (22, 23), which can be aligned with the solderable terminal region (10; 5, 30; 40, 50); and simultaneous soldering of the surface regions (5a, 5b; 35a, 35b, 35c; 60a, 60b, 60c) to the first soldering region (22', 23'; 22', 23', 22", 23") and of the terminal region (10; 5, 30; 40, 50) to the second soldering region (22, 23).

18 Claims, 7 Drawing Sheets figure 1a figure 1b figure 1c figure 1d figure 1e figure 2a figure 2d figure 3a figure 3e

CONNECTION OF INTEGRATED CIRCUIT TO A SUBSTRATE

FIELD OF INVENTION

The present invention relates to a method of connecting an integrated circuit to a substrate and to a corresponding circuit arrangement.

RELATED APPLICATION

Pursuant to 35 USC § 119 this application claims the benefit of German Patent Application No. 102 27 342.1, filed Jun. 19, 2002.

BACKGROUND

Although it can in principle be applied to any desired integrated circuits, the present invention and the problems on which is based are explained with reference to chips with integrated circuits using silicon technology.

Customary solutions for connecting an integrated circuit to a substrate are the use of solder balls of ball-grid arrays for the mechanical connection and the additional use of an underfilling, in order to increase the stability. The underfilling usually consists of an epoxy resin which is filled into the gap between the chip and the substrate. The underfilling serves for increasing the adhesion of the chip on the substrate and for increasing the stability in the x, y and z directions. A further function of the underfilling is to reduce the stresses which occur during temperature changes, and are caused by the thermal mismatch of the chip material and the substrate material.

However, it has been found to be disadvantageous with the customary solutions that the connection by the solder balls between the chip and the substrate has inadequate mechanical stability. Therefore, an underfilling is additionally used to increase the mechanical stability of the system. The introduction of the underfilling material is usually carried out at module level, to be precise after the reflow soldering of the components.

This underfilling process has the following disadvantages.

It is a serial process, in which a drop of the underfilling material has to be placed onto the edges of each individual soldered chip. It is not possible to make the process a parallel process. Moreover, the process is a slow process, since the application of each individual drop of underfilling material requires considerable time. The process cannot be reproduced very well, since bubbles and voids often remain between the chip and the substrate. Furthermore, it does not make it possible to produce delimited adhesion regions and regions which are free from underfilling material. Finally, the process is not suitable for repairing mounted circuit arrangements.

As a result of the disadvantages mentioned above, the process costs are high and the process is complex.

SUMMARY

One object of the present invention is to provide a more simple and less costly method of connecting an integrated circuit to a substrate and a corresponding circuit arrangement.

The idea on which the present invention is based is that a main area of the integrated circuit is provided with a mechanical supporting region, which has a solderable surface region, and also with a solderable electrical terminal region. The main area of the substrate is provided with a first soldering region, which can be aligned with the solderable surface region, and with a second soldering region, which can be aligned with the solderable terminal region. Then a simultaneous soldering of the surface region to the first soldering region and of the terminal region to the second soldering region is performed.

One advantage of the method according to the invention and of the corresponding circuit arrangement is the high mechanical stability in the x, y and z directions of the mounted circuits without the necessity for customary underfilling. The method according to the invention can be carried out at wafer level. Consequently, thousands of chips can be processed in parallel in one step. This drastically increases the cost efficiency and the speed.

The process according to the invention makes it possible to carry out the soldering connection simultaneously with the connection which increases the mechanical stability. Therefore, no additional process steps mare necessary during module processing. Furthermore, the process according to the invention can be carried out on any customary packaging line and, moreover, makes it possible for defectively mounted chips to be repaired in a simple manner.

According to a preferred development, the mechanical supporting structure has a plurality of discrete supports.

According to a further preferred development, the mechanical supporting structure has a continuous supporting ring.

According to a further preferred development, the surface region is metallized in a separate step.

According to a further preferred development, the metallizing is carried out simultaneously with the provision of a wiring metallization.

According to a further preferred development, the metallizing is carried out by an at least partly conductive adhesive being applied to the mechanical supporting structure.

According to a further preferred development, the metallizing is carried out by a mechanical supporting structure consisting of a non-cured polymer being scattered with metal powder in the surface region and the polymer subsequently being cured.

According to a further preferred development, the terminal region has solder balls which are applied to a wiring metallization.

According to a further preferred development, the terminal region has elastic elevations, to which a wiring metallization is applied.

According to a further preferred development, the mechanical supporting structure consists of a preferably non-conductive polymer.

According to a further preferred development, the first soldering region and/or second soldering region have metallic contact areas, which are covered with solder paste.

According to a further preferred development, the steps before the soldering are carried out at wafer level, separation into individual chips then taking place and the soldering finally being carried out at chip level.

Exemplary embodiments of the invention are explained in more detail in the description which follows and are represented in the drawings, in which:

In the figures, the same references designate the same or functionally the same components.

DETAILED DESCRIPTION

Although only one chip is respectively illustrated in the case of the examples which follow, it should be expressly mentioned that the application of the mechanical supporting structure and the soldering can preferably also be carried out at a higher level, for example wafer level.

FIGS. 1a–e are schematic representations of a method of connecting an integrated circuit to a substrate according to a first embodiment of the present invention.

Figure 1A:
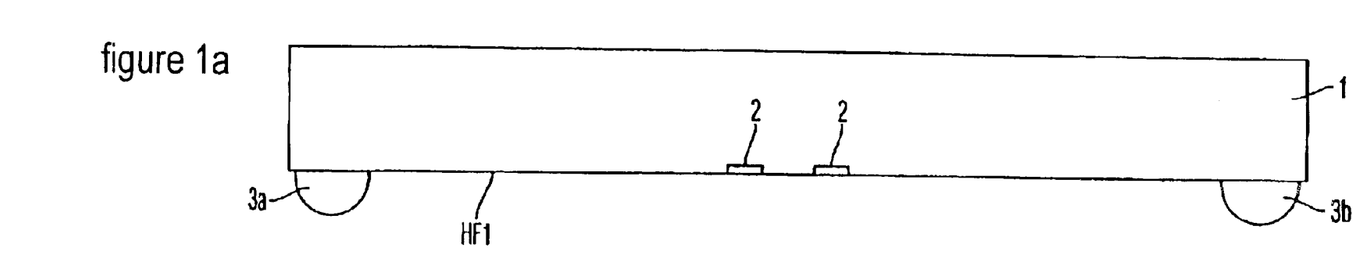
FIGS. 1a–e show schematic representations of a method of connecting an integrated circuit to a substrate according to a first embodiment of the present invention.

In FIG. 1a, reference 1 designates a chip with an integrated circuit, which is not illustrated in any more detail and has a main area HF1, on which an electrical contacting region 2 is provided for the external contacting of the integrated circuit.

In a first step of the method according to the first embodiment, a mechanical supporting structure 3a, 3b in the form of individual raised supporting regions 3a, 3b, provided at the chip periphery, is applied to the first main area HF1 of the chip 1. Although in the case of the present invention the mechanical supporting structure comprises individual discrete supports, it goes without saying that it is also possible to provide a supporting structure which is, for example, closed in an annular form or partly closed.

In the case of this embodiment, the mechanical supporting structure 3a, 3b consists of a hard, unelastic epoxy resin, but could under certain circumstances also comprise an elastic epoxy resin. The application of the mechanical supporting structure 3a, 3b is performed by a customary method, such as for example a printing method or a dispersing method.

Figure 1B:
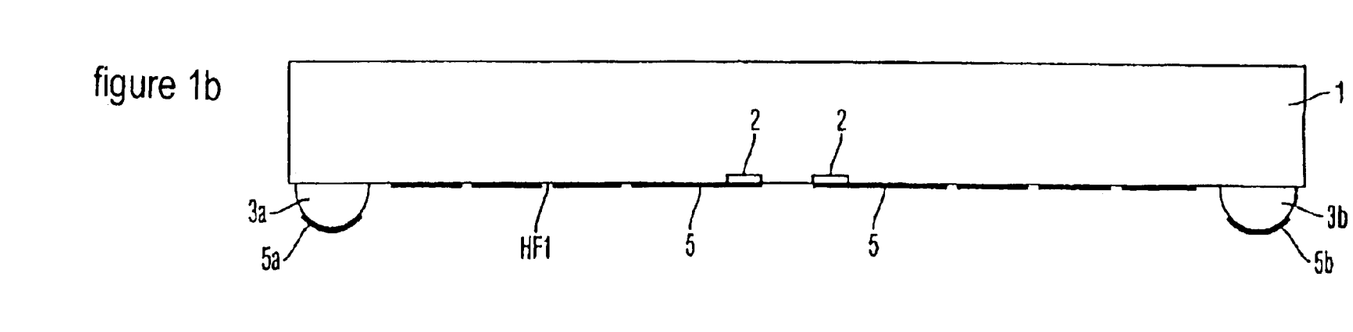

With reference to FIG. 1b, in a subsequent process step, a wiring metallization 5, which is electrically connected to the electrical contacting region 2, is provided on the first main area HF1 of the chip 1. In particular, in the portions 5a, 5b the wiring metallization extends also onto the upper side of the mechanical supporting structure 3a, 3b. In this connection, it should already be mentioned now that the surface of the mechanical supporting structure 3a, 3b must be solderable for the later step of mounting the chip 1 onto the substrate. As will be shown later, it is also possible to apply the metallization of the upper side of the mechanical supporting structure 3a, 3b in a separate process step, but application together with the wiring metallization 5 is easiest.

In the following example, the application of the wiring metallization is performed according to a standard method, such as for example a sputtering method or a plating method, in that titanium and/or copper or nickel and/or gold is deposited, with either a mask being provided in advance or an etching mask and subsequent etching being provided in a later step.

Figure 1C:
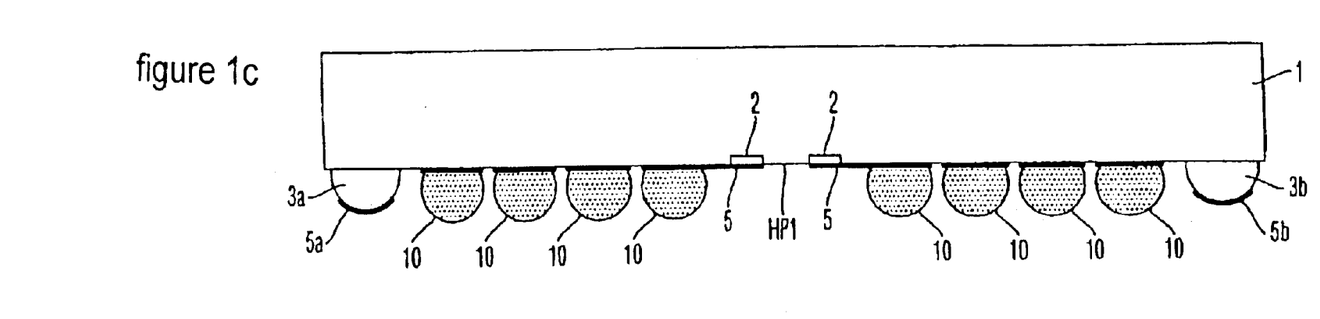

With reference to FIG. 1c, solder balls 10, by means of which the electrical connection of the integrated circuit to the substrate is later to be accomplished, are then applied to predetermined regions of the wiring metallization 5 in a known way, for example by solder beam printing [sic].

At the latest after this process step, if the previous process steps were carried out at wafer level, the wafer is divided up into individual chips.

Figure 1D:
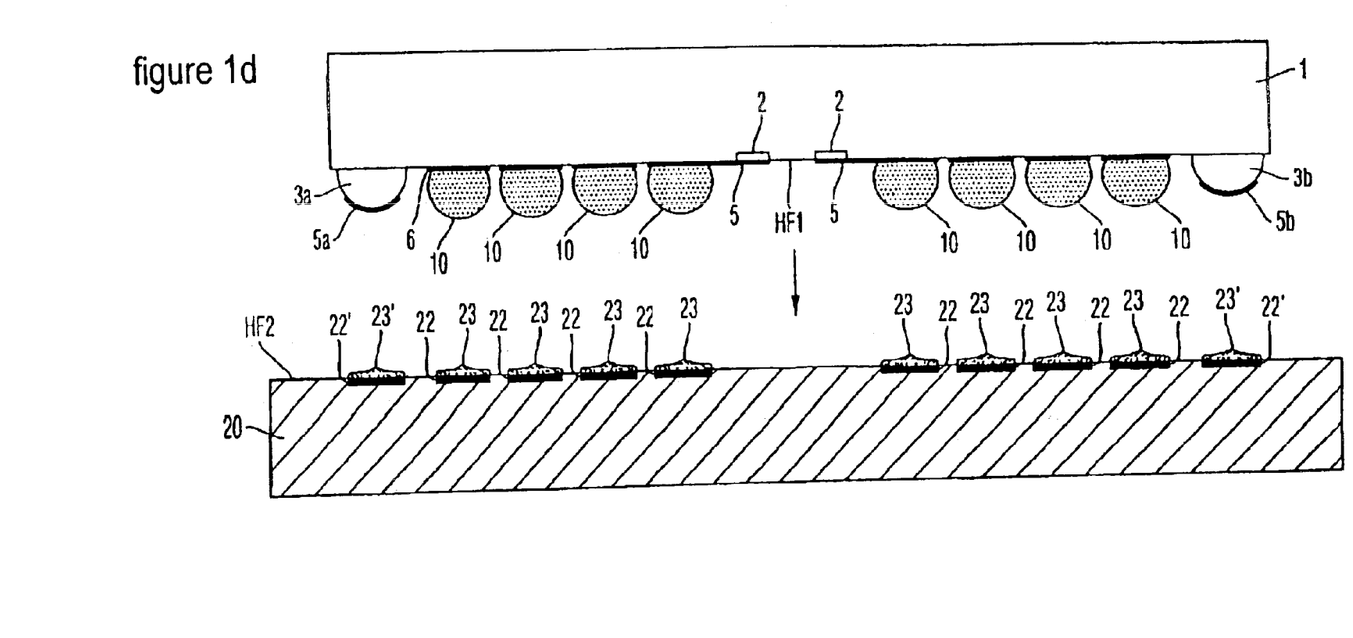

According to FIG. 1d, a substrate 20 is then provided, with a main area HF2, on which the terminal regions 22, 22' are provided and solder paste 23, 23' is provided on top. In this case, the terminal regions 22 serve for the electrical connection to the solder balls 10, whereas the terminal regions 22' serve merely for the mechanical connection of the mechanical supporting structure 3a, 3b. In the process step which then follows, the chip 1 is then aligned with respect to the substrate 20 and placed on it in such a way that the solder balls 10 contact the terminal regions 22 with the solder paste 23 and the surface metallization 5a, 5b of the mechanical supporting structure 3a, 3b contacts the terminal regions 22' with the solder paste 23' located on it. In a process step which then follows, the structure formed in this way, made up of the substrate 20 and the chip 1 placed on it, is put into a soldering furnace and securely soldered by reflow soldering.

Figure 1E:
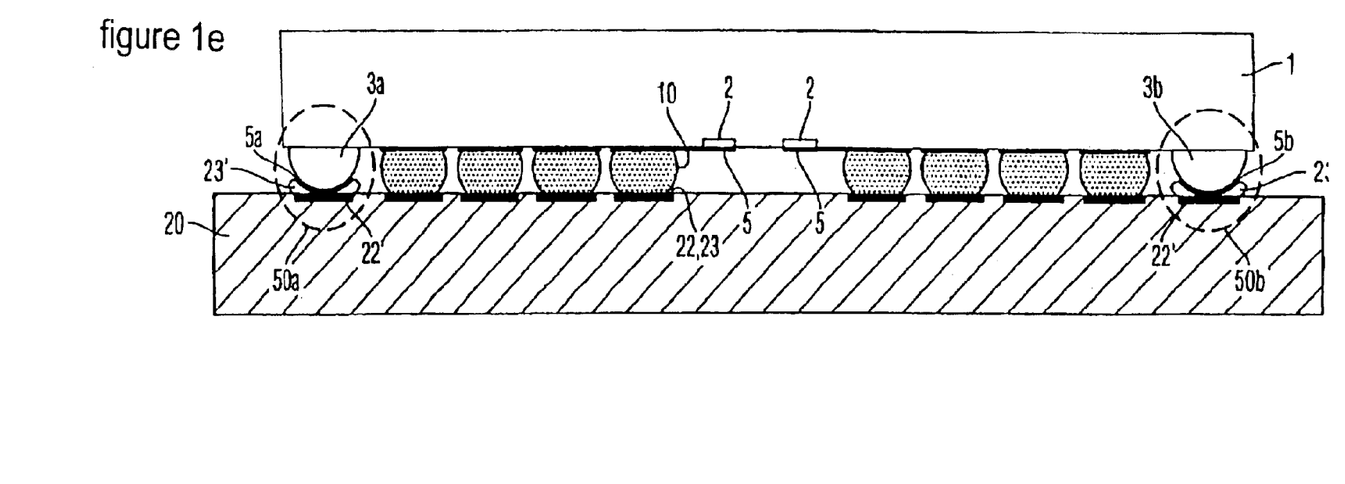

As represented in FIG. 1e, provided in the securely soldered structure along with the soldered connections by means of the solder balls 10 are mechanical stabilizing regions 50a, 50b, in which the chip 1 is securely connected to the terminal regions 22' of the substrate by means of the mechanical supporting structure 3a, 3b, the surface metallization regions 5a, 5b, the solder paste 23' [sic]. These additional mechanical supporting regions 50a, 50b lead to a reduced sensitivity with respect to shearing stresses in the x and y directions (that is in the plane of the main areas) and with respect to tensile and compressive forces in the z direction (that is perpendicular to the main areas HF1, HF2).

FIGS. 2a–d are schematic representations of a method of connecting an integrated circuit to a substrate according to a second embodiment of the present invention.

Figure 2A:
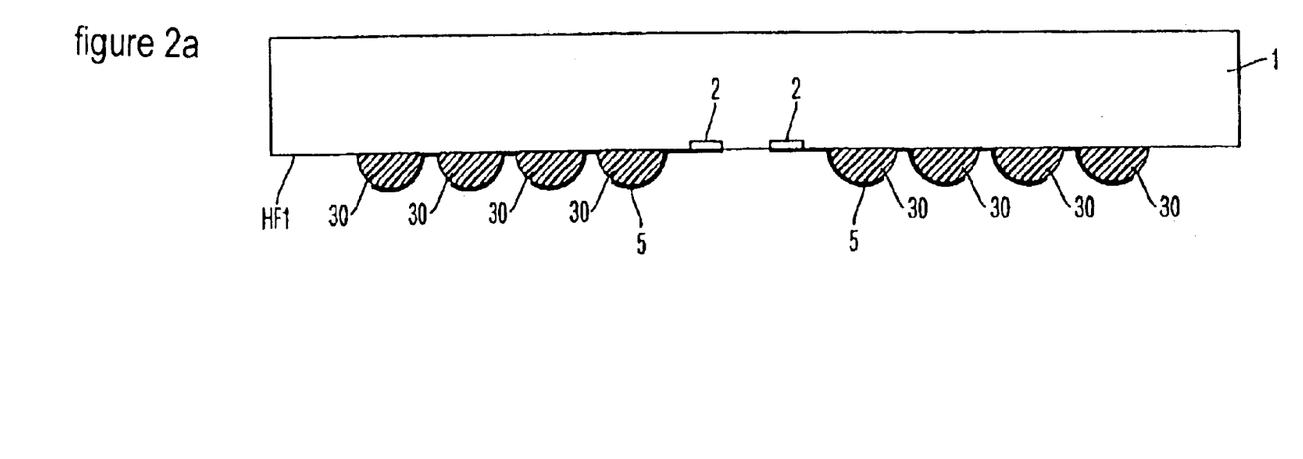
FIGS. 2a–d show schematic representations of a method of connecting an integrated circuit to a substrate according to a second embodiment of the present invention.

In the case of the second embodiment, according to FIG. 2a, firstly an arrangement of elastic elevations 30 is provided on the main area HF1 of the chip 1 and the wiring metallization 5 is brought onto these elevations according to the method described in connection with the first exemplary embodiment. The elastic elevations 30 expediently consist of a polymer with the desired elasticity.

Figure 2B:
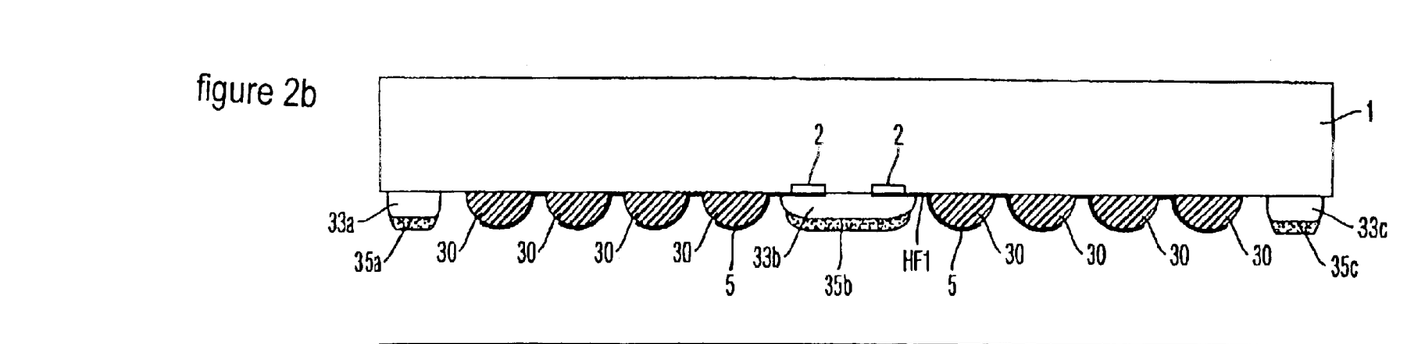

In a process step which then follows and is illustrated in FIG. 2b, a mechanical supporting structure 33a, 33b, 33c in the form of discrete supports is then provided on the main area HF1 of the chip 1. As in the case of the first exemplary embodiment, these supporting regions consist of a polymer of suitable hardness or elasticity, which is applied to the main area HF1, for example by means of a printing technique. As a difference from the first embodiment, in the case of this second embodiment a central mechanical supporting region 33b is also provided in addition to the peripheral supporting regions 33a, 33c. An anisotropically conducting (partly conducting) solderable adhesive 35a, 35b, 35c is then applied to the mechanical supporting structure 33a, 33b, 33c by an application method known per se.

Figure 2C:
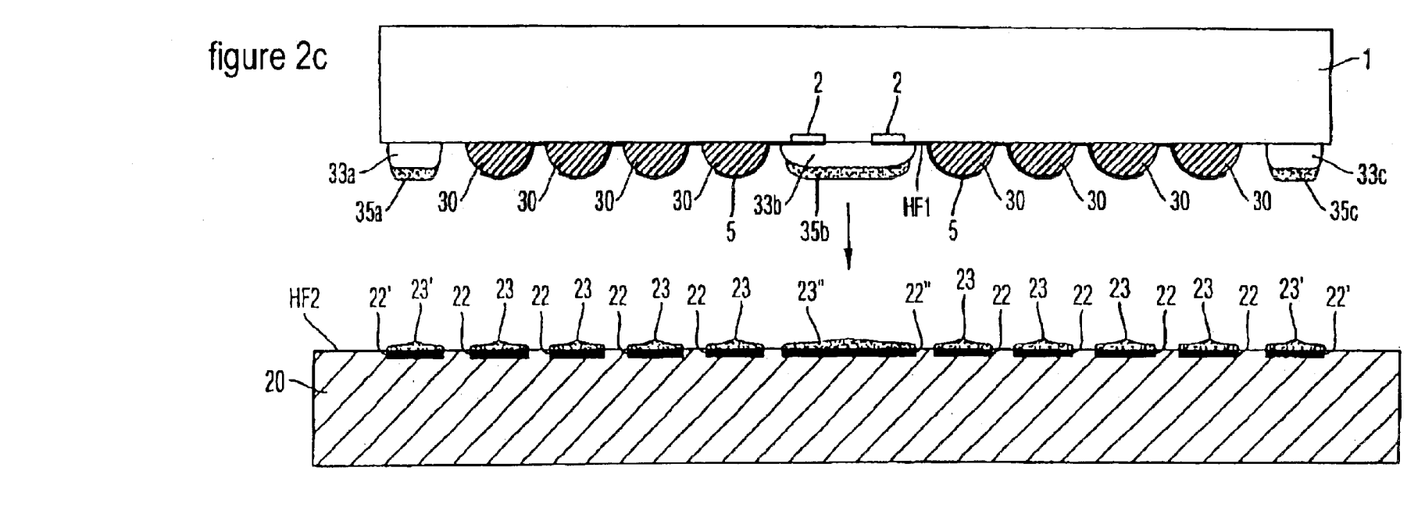

With further reference to FIG. 2c, the provision of the substrate 20 is performed, on the main area HF1 of which the terminal regions 22 with the solder paste 23 are provided for the electrical connection to the wiring metallization and the terminal regions 22', 22" with the solder paste 23', 23" are provided for the mechanical connection to the supporting structure 33a, 33b, 33c by means of the solderable surface regions 35a, 35b, 35c.

Figure 2D:
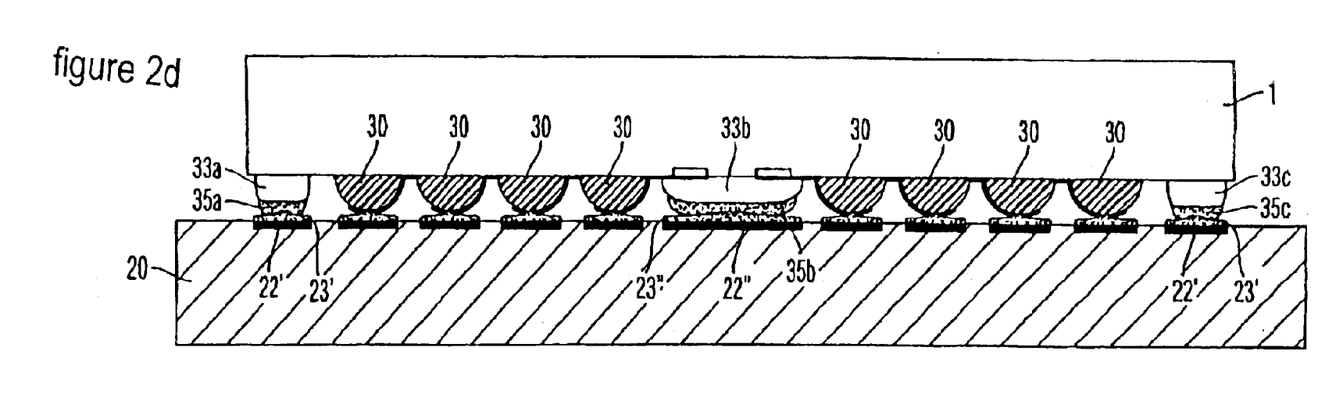

With reference to FIG. 2d, as in the case of the first exemplary embodiment, the chip 1 is then aligned with respect to the substrate 20 and correspondingly placed on it, so that the respective soldering regions lie one on top of the other. As already described above, the reflow soldering is finally performed to create a solid connection between the chip 1 and the substrate 20.

FIGS. 3*a*–*e* are schematic representations of a method of connecting an integrated circuit to a substrate according to a third embodiment of the present invention.

Figure 3A:
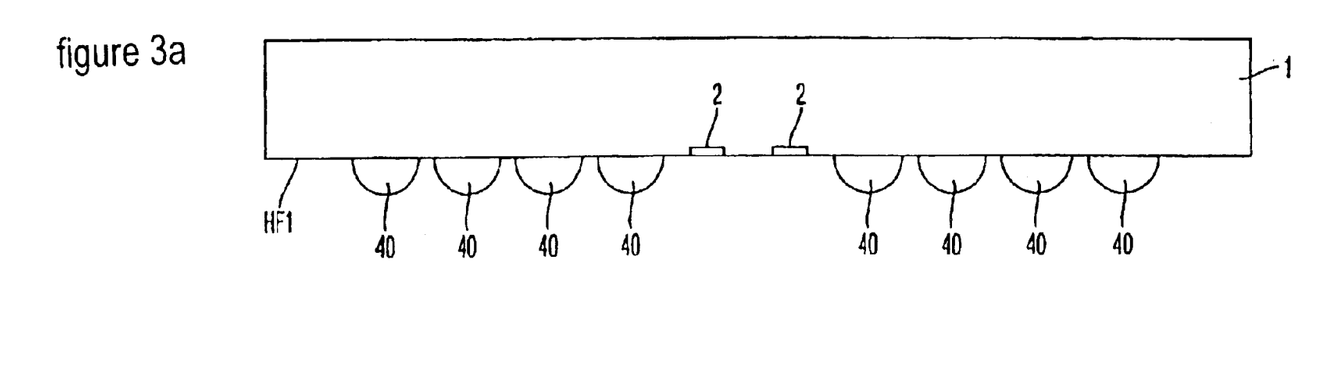
FIGS. 3a–e show schematic representations of a method of connecting an integrated circuit to a substrate according to a third embodiment of the present invention.

In the case of the third embodiment, according to FIG. 3*a*, firstly an isotropically conducting adhesive 40 is applied in the form of elevations 40 to the main area HF1 of the chip 1. This takes place, for example, by means of a customary printing method.

Figure 3B:
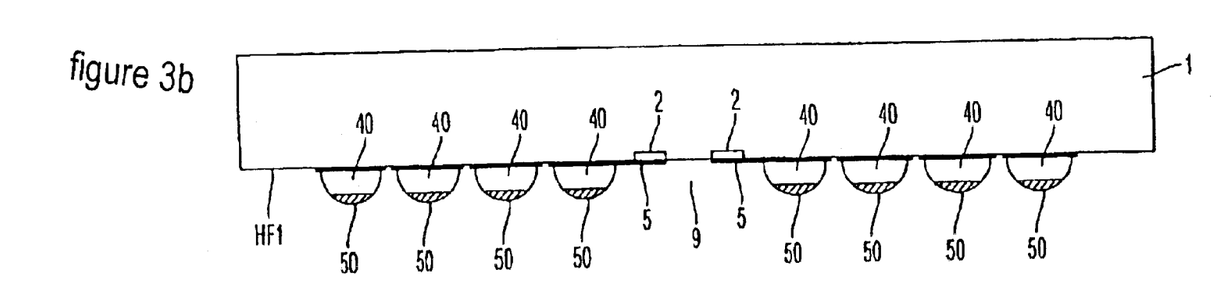

According to FIG. 3*b*, the depositing and structuring of the wiring metallization 5 is then performed in such a way that cap-shaped surface regions of the elevations 40 are covered by it.

Figure 3C:
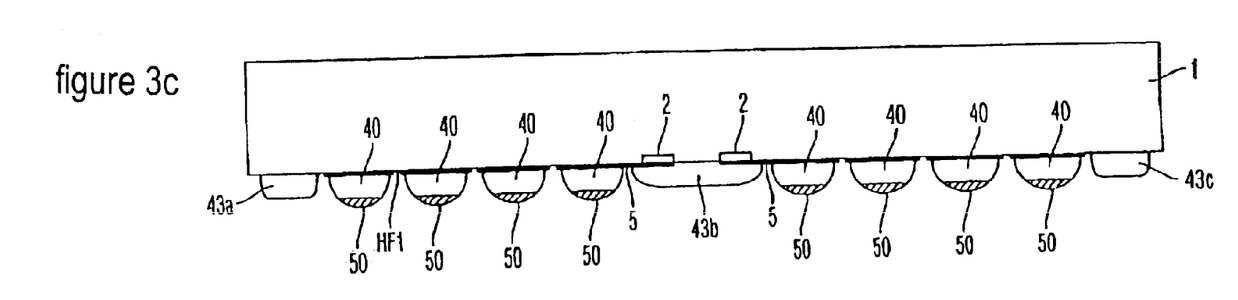

In a process step which then follows, according to FIG. 3*c*, mechanical supporting regions 43*a*, 43*b*, 43*c* which consist of a non-conducting adhesive are then provided, as in the case of the second embodiment, in the periphery and the center of the chip 1, and are left in the non-cured state.

Figure 3D:
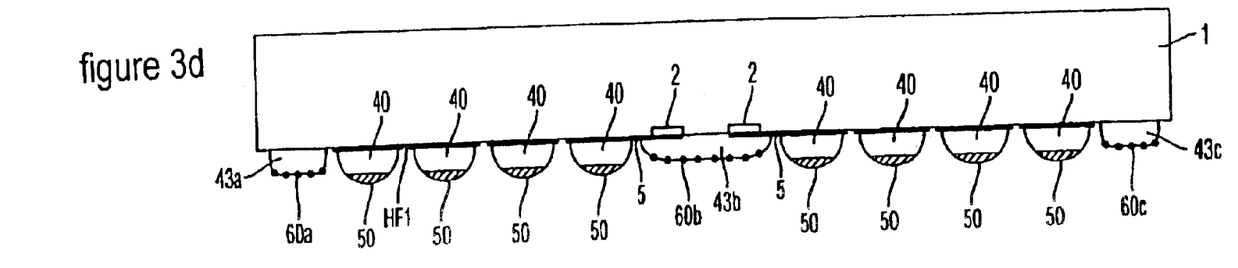

According to FIG. 3*d*, the chip 1 or the wafer with the chips 3 is then immersed in a metal powder (for example copper, silver, nickel, lead/tin, . . . ), so that metal powder particles 60*a*, 60*b*, 60*c* remain adhering on the surface of the mechanical supporting structure 43*a*, 43*b*, 43*c* and consequently form solderable regions on the surface of the mechanical supporting structure 43*a*, 43*b*, 43*c*.

In the process step which then follows, curing of the adhesive of which the mechanical supporting structure 43*a*, 43*b*, 43*c* consists is then performed, so that the metal particle regions 60*a*, 60*b*, 60*c* are fixed.

Figure 3E:
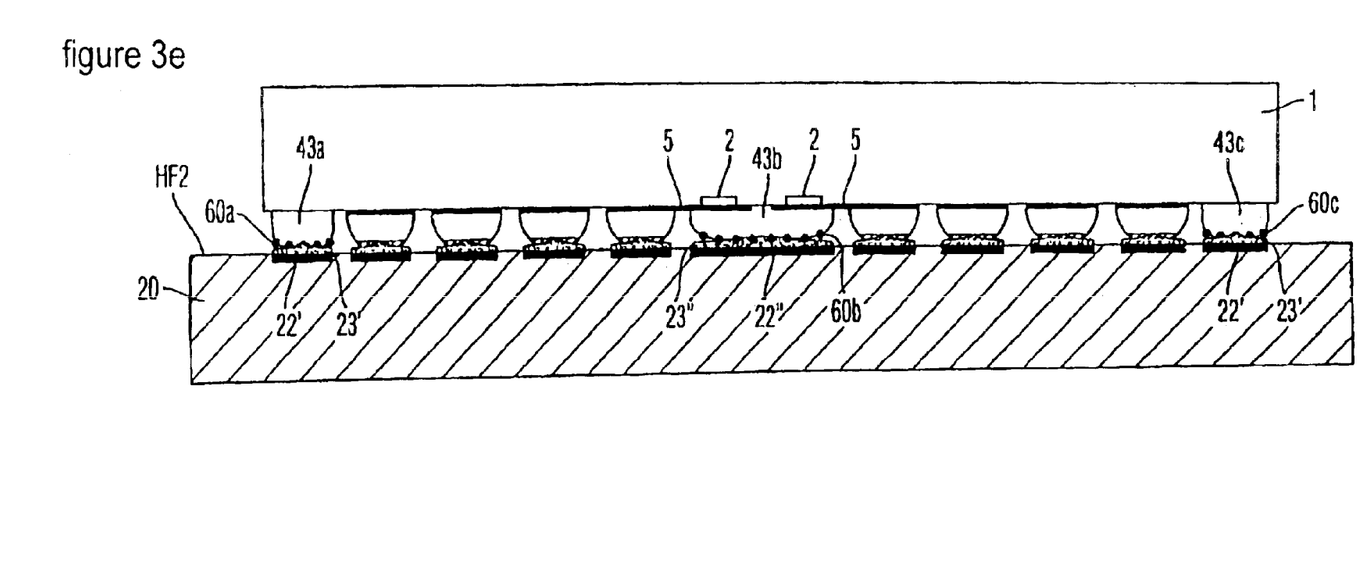

In the process step which then follows and is illustrated in FIG. 3*e*, the aligning of the chip 1 and the correspondingly prepared substrate 20 is then in turn performed, as in the case of the second embodiment explained above, and the reflow soldering is performed, in order to provide a solid connection between the chip 1 and the substrate 20 by means of the soldering regions.

Although the present invention has been described above on the basis of preferred exemplary embodiments, it is not restricted to these, but instead can be modified in various ways.

The present invention can consequently be applied in particular also to wafer level packages (WLP) or ball-grid-array packages (BGA) or else to hybrids, wafers or other integrated circuits.

| List of references | |
|---|---|
| 1 | chip |
| HF1 | main area |
| 2 | contacting region |
| 3a, 3b; 33a, 33b, 33c; 43a, 43b, 43c | mechanical supporting structure |
| 5a, 5b | surface metallization |
| 20 | substrate |
| HF2 | main area |
| 50a, 50b | mechanical supporting regions |
| 22, 22', 22" | terminal regions of 20 |
| 23, 23', 23" | solder paste |
| 10 | solder balls |
| 30 | elastic elevations |
| 5 | wiring metallization |

| List of references -continued | |
|---|---|
| 35a, 35b, 35c | surface metallization |
| 40 | isotropically conducting adhesive |
| 50 | cap region of 5 on 40 |
| 60a, 60b, 60c | metal powder particles |

What is claimed is:

1. A method of connecting an integrated circuit to a substrate, the method comprising:
   forming an integrated circuit, the integrated circuit having a main area on which is disposed an electrical contacting region;
   forming a mechanical supporting structure on the main area of the integrated circuit;
   forming a solderable surface region on the mechanical supporting structure;
   connecting a solderable terminal region to the electrical contacting region;
   providing a substrate, the substrate having a main area;
   forming a first soldering region on the main area of the substrate, the first soldering region being alignable with the solderable surface region on the mechanical supporting structure of the integrated circuit;
   forming a second soldering region on the main area of the substrate, the second soldering region being alignable with the solderable terminal region of the integrated circuit;
   simultaneously soldering the surface region to the first soldering region and soldering the terminal region to the second soldering region, wherein the steps before soldering the surface region and the terminal region are carried out at a wafer level; the method further comprising separating the wafer into individual chips; and soldering the surface region and the terminal region at a chip level.

2. The method of claim 1, wherein forming the mechanical supporting structure comprises providing a plurality of discrete supports.

3. The method of claim 1, wherein forming the mechanical supporting structure comprises forming a continuous supporting ring.

4. The method of claim 1, wherein forming the solderable surface region comprises metallizing the solderable surface region onto the mechanical supporting structure in a separate step.

5. The method according to claim 4, further comprising providing wiring metallization simultaneously with metallizing the solderable surface region.

6. The method according to claim 4, wherein metallizing comprises applying an at least partly conductive adhesive to the mechanical supporting structure.

7. The method according to claim 4, wherein metallizing comprises providing a non-cured polymer on the mechanical support structure, scattering metal powder on the solderable surface region, and curing the polymer.

8. The method according to claim 1, further comprising applying solder balls to a wiring metallization.

9. The method according to claim 1, further comprising providing elastic elevations on the terminal region, and applying a wiring metallization to the elastic elevations.

10. The method according to claim 1, wherein forming the mechanical supporting structure comprises forming a mechanical supporting structure from a non-conductive polymer.

11. The method according to claim 1, further comprising covering at least one of the first soldering region and the second soldering region with solder paste.

12. A circuit arrangement comprising:

an integrated circuit, having a main area;

an electrical contacting region located on the main area, the electrical contacting region having a solderable terminal region;

a mechanical supporting structure attached to the main area, the mechanical supporting structure having a solderable surface region;

a substrate having a main area;

a first soldering region on the main area of the substrate, the first solderable region being soldered to the solderable surface region of the integrated circuit;

a second soldering region on the main area of the substrate, the second soldering region being soldered to the solderable terminal region of the electrical contacting region, wherein a metallization is applied onto the mechanical support structure.

13. The circuit arrangement of claim 12, wherein the mechanical supporting structure comprises a plurality of discrete supports.

14. The circuit arrangement of claim 12, wherein the mechanical supporting structure comprises a continuous supporting ring.

15. The circuit arrangement of claim 12, wherein the terminal region comprises solder balls applied to a wiring metallization.

16. The circuit arrangement of claim 12, wherein the terminal region comprises an elastic elevation to which a wiring metallization is applied.

17. The circuit arrangement of claim 12, wherein the mechanical supporting structure comprises a non-conductive polymer.

18. The circuit arrangement of claim 12, wherein at least one of the first soldering region and the second soldering region comprises a metallic contact area covered with solder paste.

* * * * *